US011070026B2

(12) United States Patent
Kaymaksut

(10) Patent No.: US 11,070,026 B2
(45) Date of Patent: Jul. 20, 2021

(54) HIGH CURRENT NANOSECOND LASER DRIVER CIRCUIT WITH WIDE PULSE-WIDTH ADJUSTMENT RANGE

(71) Applicant: Analog Devices International Unlimited Company, Limerick (IE)

(72) Inventor: Ercan Kaymaksut, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 88 days.

(21) Appl. No.: 16/517,293

(22) Filed: Jul. 19, 2019

(65) Prior Publication Data

US 2021/0021098 A1    Jan. 21, 2021

(51) Int. Cl.
*H01S 5/042*    (2006.01)

(52) U.S. Cl.
CPC .................. *H01S 5/0428* (2013.01)

(58) Field of Classification Search
CPC .. H01S 5/0428; H01S 5/0608; H01S 5/06253; H02M 3/08; H01L 33/64; H01L 33/508
USPC .................. 372/25, 38.02; 327/108
See application file for complete search history.

(56) References Cited

U.S. PATENT DOCUMENTS

| | | | |
|---|---|---|---|
| 3,976,932 A * | 8/1976 | Collins ................. | H02M 7/537 363/132 |
| 5,132,553 A * | 7/1992 | Siegel ................. | H04L 12/5601 327/109 |
| 5,610,452 A | 3/1997 | Shimer et al. | |
| 5,869,988 A * | 2/1999 | Jusuf ...................... | G11B 5/022 327/110 |
| 6,697,402 B2 | 2/2004 | Crawford | |
| 6,731,449 B2 * | 5/2004 | Okazaki ................... | G11B 5/02 327/110 |
| 7,161,818 B2 | 1/2007 | Kirchmeier et al. | |
| 7,180,921 B2 | 2/2007 | Mangano et al. | |
| 7,426,226 B2 | 9/2008 | Motoyama | |
| 9,123,467 B2 | 9/2015 | Wu et al. | |
| 9,300,113 B2 | 3/2016 | Hoffman et al. | |
| 9,846,319 B2 * | 12/2017 | Bergmann .......... | H01S 3/10038 |
| 9,923,334 B2 | 3/2018 | Stiffler et al. | |
| 10,103,513 B1 | 10/2018 | Zhang et al. | |
| 2004/0037100 A1 | 2/2004 | Orr et al. | |

(Continued)

FOREIGN PATENT DOCUMENTS

| | | |
|---|---|---|
| CN | 101637065 B | 11/2011 |
| DE | 102017121114 A1 | 3/2019 |
| DE | 102017121115 A1 | 3/2019 |
| DE | 102018120271 A1 | 3/2019 |
| DE | 102018120624 A1 | 3/2019 |

(Continued)

OTHER PUBLICATIONS

"U.S. Appl. No. 16/555,506, Non Final Office Action dated Feb. 5, 2021", 12 pgs.

(Continued)

*Primary Examiner* — Tuan N Nguyen
(74) *Attorney, Agent, or Firm* — Schwegman Lundberg & Woessner, P.A.

(57) ABSTRACT

A resonant H-bridge laser driver circuit topology is described that can achieve high current levels at narrow pulse widths while using smaller transistor sizes. The resonant H-bridge topology can utilize parasitic inductors in conjunction with an external capacitor to create a resonant circuit in parallel with the load.

23 Claims, 7 Drawing Sheets

(56) References Cited

U.S. PATENT DOCUMENTS

| | | | |
|---|---|---|---|
| 2007/0268725 A1* | 11/2007 | Hatanaka | H02M 7/538 363/17 |
| 2011/0157251 A1 | 6/2011 | Lim et al. | |
| 2012/0106981 A1 | 5/2012 | Moto et al. | |
| 2012/0268969 A1 | 10/2012 | Cuk | |
| 2012/0287678 A1* | 11/2012 | Xu | H02M 3/158 363/17 |
| 2013/0188397 A1 | 7/2013 | Wu et al. | |
| 2014/0211192 A1 | 7/2014 | Grootjans et al. | |
| 2017/0085057 A1 | 3/2017 | Barnes et al. | |
| 2018/0261975 A1 | 9/2018 | Pavlov et al. | |
| 2018/0278017 A1 | 9/2018 | Mignoli et al. | |
| 2021/0066885 A1 | 3/2021 | Kuo et al. | |

FOREIGN PATENT DOCUMENTS

| | | |
|---|---|---|
| EP | 2753898 B1 | 8/2016 |
| EP | 3064957 A1 | 9/2016 |
| JP | H0869631 A | 3/1996 |
| JP | 5159355 B2 | 12/2012 |
| JP | 2016152336 A | 8/2016 |
| KR | 20120129214 A | 11/2012 |
| KR | 101746921 B1 | 6/2017 |

OTHER PUBLICATIONS

"U.S. Appl. No. 16/555,506, Response filed Apr. 30, 2021 to Non Final Office Action dated Feb. 5, 2021", 9 pgs.

* cited by examiner

HIGH CURRENT NANOSECOND LASER DRIVER CIRCUIT WITH WIDE PULSE-WIDTH ADJUSTMENT RANGE

FIELD OF THE DISCLOSURE

This document pertains generally, but not by way of limitation, to integrated circuits, in particular to circuits for driving laser diodes.

BACKGROUND

Optical systems such as light detection and ranging (LIDAR) systems, time-of-flight cameras and range finders, can pulse diodes and measure reflected light to determine the presence, distance information, depth information, and/or speed information of an object. These optical systems can be used in automotive systems, security systems, medical systems, aerospace systems, for example.

Diodes can be used as a light source for many optical applications. In some applications, laser diodes can be used due to their ability to generate a great deal of light. Other diodes (e.g., light-emitting diodes) or electrically-driven light sources can be used.

Diodes can emit light as a function of the current conducted through the diode. To implement an optical application, a driver circuit can be used to provide the current to the diode so that light can be emitted. Diode driver circuits can vary depending on the requirements of the application, system design, and constraints imposed by the circuit providing the diodes.

SUMMARY OF THE DISCLOSURE

This disclosure is directed to, among other things, a resonant H-bridge laser diode circuit topology that is able to achieve much high current levels can be obtained at narrow pulse widths while using smaller transistor sizes. The resonant H-bridge topology of this disclosure can utilize parasitic inductors that are unavoidable in conjunction with an external capacitor to create a resonant circuit in parallel with the load. Pulse widths from about 1 nsec to about 10 nsec can be obtained from a single package, which cannot be obtained using pre-charging architectures.

In some aspects, this disclosure is directed to a laser diode driver circuit having an H-bridge configuration having first and second pairs of transistors, the laser diode driver circuit comprising a load including a laser diode, the load coupled between the first and second pairs of transistors; and a resonant circuit coupled between the first and second pairs of transistors, the resonant circuit including a capacitor coupled in parallel with the load.

In some aspects, this disclosure is directed to a method of operating a laser diode driver circuit having an H-bridge configuration having first and second pairs of transistors, a load including a laser diode, the load coupled between the first and second pairs of transistors, and a resonant circuit coupled between the first and second pairs of transistors, the resonant circuit including a capacitor coupled in parallel with the load. The method comprises during a first state, controlling the first and second pairs of transistors to apply a reverse bias voltage across the laser diode and to apply a negative supply voltage across the capacitor. The method comprises during a second state: controlling the first and second pairs of transistors to apply a forward bias voltage across the laser diode and to apply a positive supply voltage across the capacitor; and increasing a voltage across the capacitor above the positive supply voltage and generating a laser pulse using the laser diode.

In some aspects, this disclosure is directed to a method of operating a laser diode driver circuit having an H-bridge configuration having first and second pairs of transistors, a load including a laser diode, the load coupled between the first and second pairs of transistors, and a resonant circuit coupled between the first and second pairs of transistors, the resonant circuit including a capacitor coupled in parallel with the load, the method comprising: during a first state, controlling the first and second pairs of transistors to couple an anode of the laser diode to a first voltage and a cathode of the laser diode to the first voltage; during a second state, controlling the first and second pairs of transistors to apply a reverse bias voltage across the laser diode and to apply a negative supply voltage across the capacitor; and during a third state: controlling the first and second pairs of transistors to apply a forward bias voltage across the laser diode and to apply a positive supply voltage across the capacitor; and increasing a voltage across the capacitor above the positive supply voltage and generating a laser pulse using the laser diode.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Optical systems such as light detection and ranging (LIDAR) systems, time-of-flight cameras, and range finders, can emit one or more trains of light pukes (e.g., modulated light source) toward one or more objects, and the arrival time of the light reflected from the object(s) is recorded. Based on the arrival time and the speed of light, the distance between the light source and the object(s) can be derived.

A diode can be driven with narrow and high current pulses to emit a train of light pulses onto the object, which can be meters away. The speed of light is very fast, therefore very short light pulses are needed to achieve meter or centimeter resolution. Accordingly a train of narrow current pulses is needed to drive the diode to generate the train of short light pulses.

Laser drivers in time of flight (ToF) based LIDAR systems use high powered short pulses from 100 picoseconds (psec) to 100 nanoseconds (nsec). The power of these pulses can sometimes be limited by concerns for eye safety. Approaches for architectures for these drivers can include resonant capacitive discharge architectures or hard switching field-effect transistor (FET) architectures. The FETs can be metal-oxide-semiconductor (MOS) FETs or gallium nitride (GAN) FETs, but are not limited to these particular FETs.

For a high-power LIDAR application, the relationship between pulse width and power can be determined by the equation V=L*(di/dt) and some architecture related constants, where V is the voltage, L is the inductance, and di/dt is the rate of change of the current. The voltage V can be set by the voltage of the driver. The inductance L can be determined by the material properties and physical dimensions between the driver and the laser diode. For a given inductance and voltage, the optical power (proportional to current) can be determined by the pulse width. Generally speaking, shorter, higher power pulses can be used to see further, distinguish objects, and stay within the eye safety limit.

In long range LIDAR applications, very narrow and high intensity laser pulses can be used to achieve a desired range and resolution. As a result, a laser driver should deliver very narrow and high amplitude current pulses.

The present inventor has recognized that by modifying a non-resonant H-bridge topology into a resonant H-bridge topology, much high current levels can be obtained at narrow pulse widths while using smaller transistor sizes. The resonant H-bridge topology of this disclosure can utilize parasitic inductors that are unavoidable in conjunction with an external capacitor to create a resonant circuit in parallel with the load. Pulse widths from about 1 nsec to about 10 nsec can be obtained from a single package, which cannot be obtained using pre-charging architectures.

Figure 1:
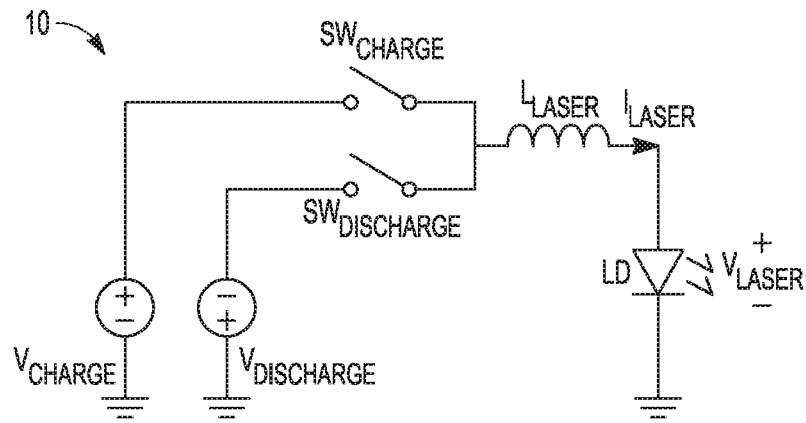
FIG. 1 is a schematic diagram of an example of a laser diode driver circuit.

FIG. 1 is a schematic diagram of an example of a laser diode driver circuit 100. In FIG. 1, a high-voltage switch $SW_{charge}$ can be used to switch the laser diode LD and its parasitic inductance $L_{laser}$ to a supply voltage $V_{charge}$.

Figure 2A:
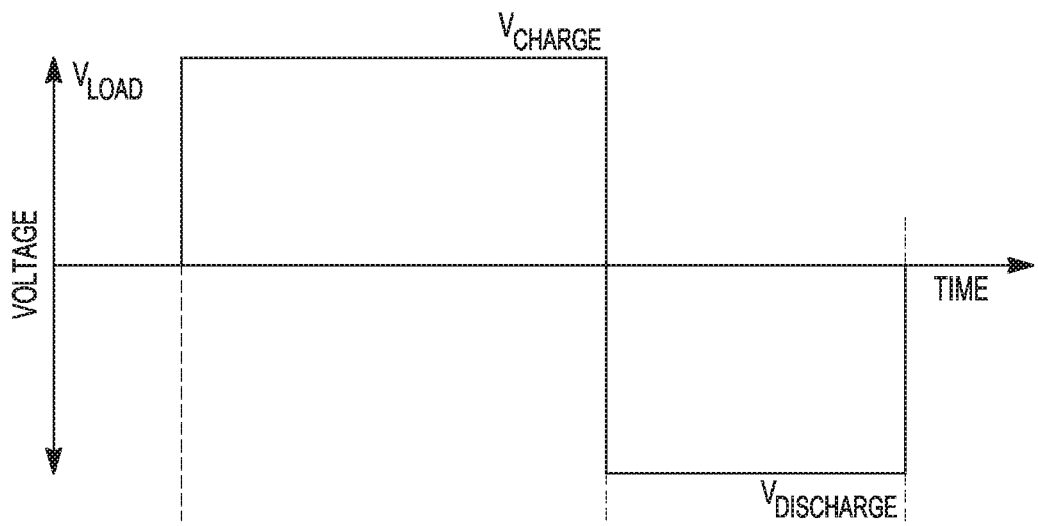
FIGS. 2A and 2B depict various waveforms associated with the circuit of FIG. 1.
Figure 2B:
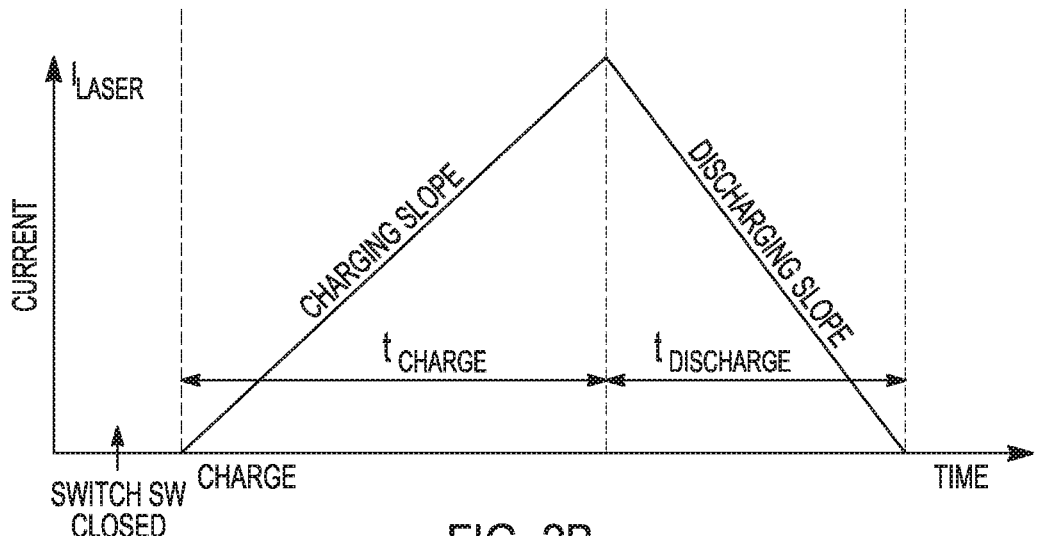

When the switch $SW_{charge}$ is closed, the voltage applied to the load, which includes the laser diode LD and its parasitic inductance $L_{laser}$ increases to voltage $V_{charge}$, as seen in FIG. 2A, and the laser current increases, as seen in FIG. 2B. The charging slope of the laser current (di/dt), shown in FIG. 2B, can be calculated as follows:

$$\text{Charging slope} = (V_{charge} - V_{laser})/L_{laser}, \quad \text{Equation (1)}$$

where the voltage $V_{charge}$ is the supply voltage, the voltage $V_{laser}$ is the voltage across the laser diode LD, and $L_{laser}$ is the parasitic inductance of the laser diode LD. As a result, in order to achieve high charging slope, high charging voltages and very low laser inductances are desirable.

At the end of the charging time, the switch $SW_{charge}$ can be opened and the switch $SW_{charge}$ can be closed, which couples the laser diode LD and its parasitic inductance $L_{laser}$ to a negative discharge voltage $V_{discharge}$, as seen in FIG. 1, to discharge the current on the laser inductance. The discharging slope can be calculated as follows:

$$\text{Discharging slope} = (-V_{discharge} - V_{laser})/L_{laser}, \quad \text{Equation (2)}$$

where the voltage $V_{discharge}$ is the negative discharge voltage, the voltage $V_{laser}$ is the voltage across the laser diode LD, and $L_{laser}$ is the parasitic inductance of the laser diode LD.

Similar to the charging case, high negative discharging voltages and very low laser inductance are desirable to achieve high discharging slope. Assuming that the laser inductance Laser is minimized, a way to further increase the charging and discharging slopes (di/dt) is to apply high charging and discharging voltages. However, applying very high voltages has technological limitations. The physical size of the switches increases with the increasing breakdown voltage. As a result, the parasitic inductance of the switch devices is in series with the laser inductance $L_{laser}$ and can undo the effect of applying larger supply voltages.

In this disclosure, the switches (also referred to as switch devices) described can be transistors, such as high-power FETs. The FETs can be metal-oxide-semiconductor (MOS) FETs or gallium nitride (GAN) FETs but are not limited to these particular FETs. Some of the possible implementations of the switches are power MOSFETs, GaN FETs, and silicon carbide (SiC) FETs. The laser diodes described in this disclosure can generate visible light and (near) infrared light, for example.

FIGS. 2A and 2B depict various waveforms associated with the circuit of FIG. 1. In FIG. 2A, the x-axis represents time and the y-axis represents voltage, and the graph depicts the voltage across the laser diode LD load. As seen in FIG. 2A, after the switch $SW_{CHARGE}$ is closed, the voltage across the load increase to the supply voltage $V_{CHARGE}$. At the end of the charging time, the switch $SW_{CHARGE}$ can be opened and the switch $SW_{DISCHARGE}$ can be closed, thereby applying a negative discharge voltage $V_{DISCHARGE}$ across the load.

In FIG. 2B, the x-axis represents time and the y-axis represents current, and the graph depicts the current through the laser diode LD. As seen in FIG. 2B, after the switch $SW_{CHARGE}$ is closed, the laser diode current increases (charging slope). At the end of the charging time, the switch $SW_{CHARGE}$ can be opened and the switch $SW_{DISCHARGE}$ can be closed, and the laser diode current decreases (discharging slope).

Figure 3:
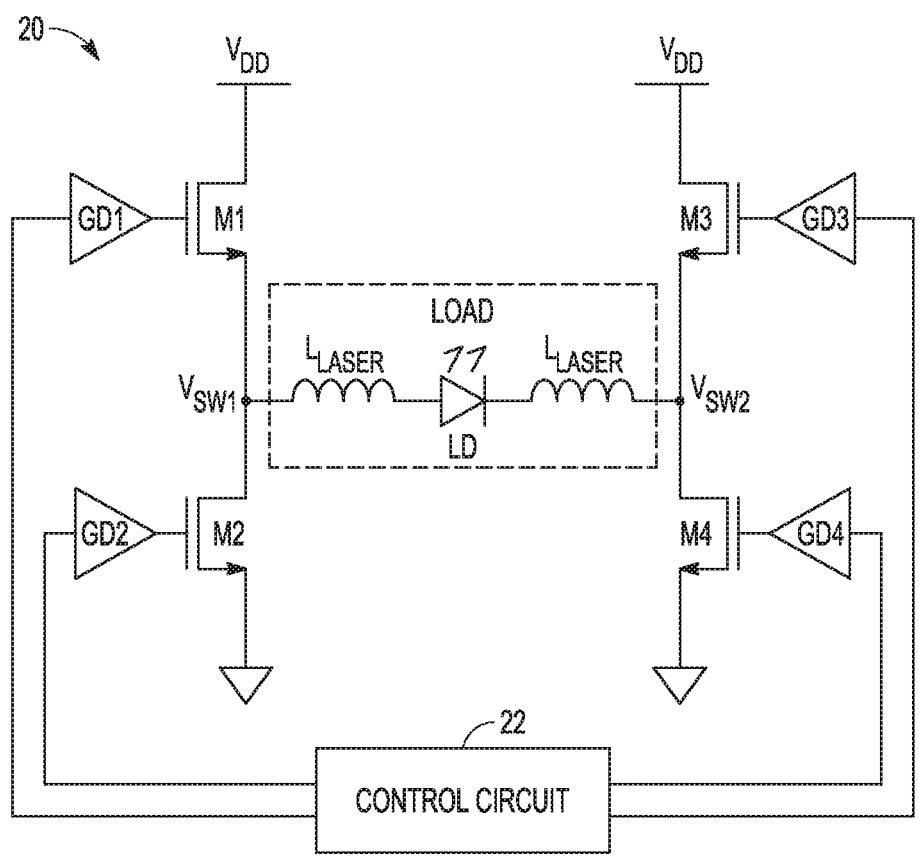
FIG. 3 is a schematic diagram of another example of a laser diode driver circuit.

FIG. 3 is a schematic diagram of another example of a laser diode driver circuit. In particular, FIG. 3 depicts a H-bridge topology of a laser diode driver circuit 20. The circuit 20 can include a first pair of transistors M1, M2, a second pair of transistors M3, M4, and a load coupled between the first and second pairs of transistors. The load can include a laser diode LD and one or more inductances $L_{LASER}$. The transistors M1-M4 can be coupled to corresponding gate drivers GD1-GD4 and a control circuit 22 can control the operation of the transistors M1-M4.

In operation, the circuit 22 can have three states: an idle state, a charging state, and a discharging state. In the idle state, both the anode and cathode sides of the laser diode LD can be grounded. For example, transistors M2 and M4 can be turned ON (to act as a short circuit) and transistors M1 and M3 can be turned OFF (to act as an open circuit).

In the charging state, the positive supply voltage $V_{DD}$ can be applied to the laser diode LD. For example, transistors M1 and M4 can be turned ON (to act as a short circuit) and transistors M2 and M3 can be turned OFF (to act as an open circuit).

In the discharging state, the voltage can be reversed on the laser diode LD to reduce the current on the laser diode. In this state, the cathode side of the laser diode LD can be coupled to the supply voltage $V_{DD}$ by turning ON the transistor M3 and the anode side of the laser diode LD can be coupled to ground by turning ON the transistor M2. The transistors M1 and M4 can be turned OFF (to act as open circuits). After the discharging state the driver returns to idle state.

Figure 4A:
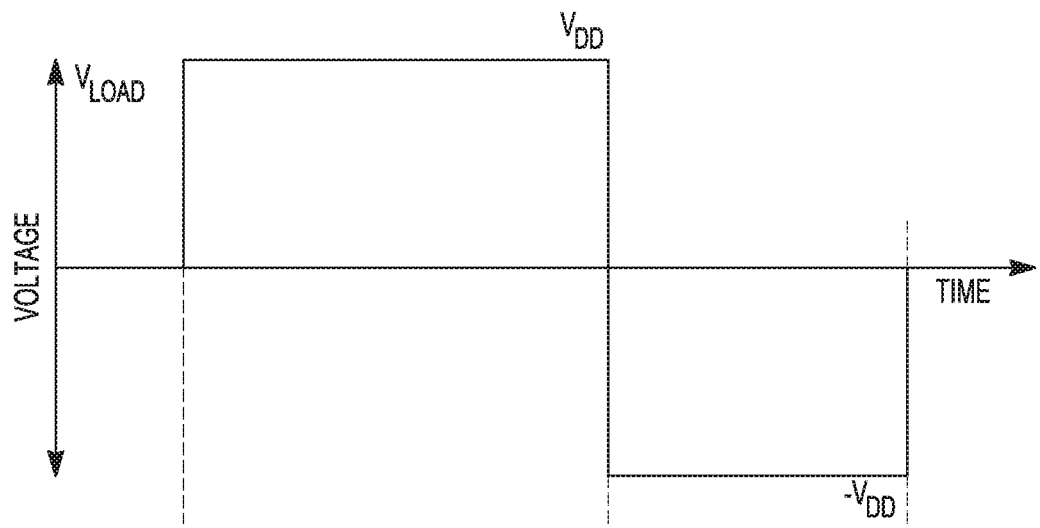
FIGS. 4A and 4B depict various waveforms associated with the circuit of FIG. 3.
Figure 4B:
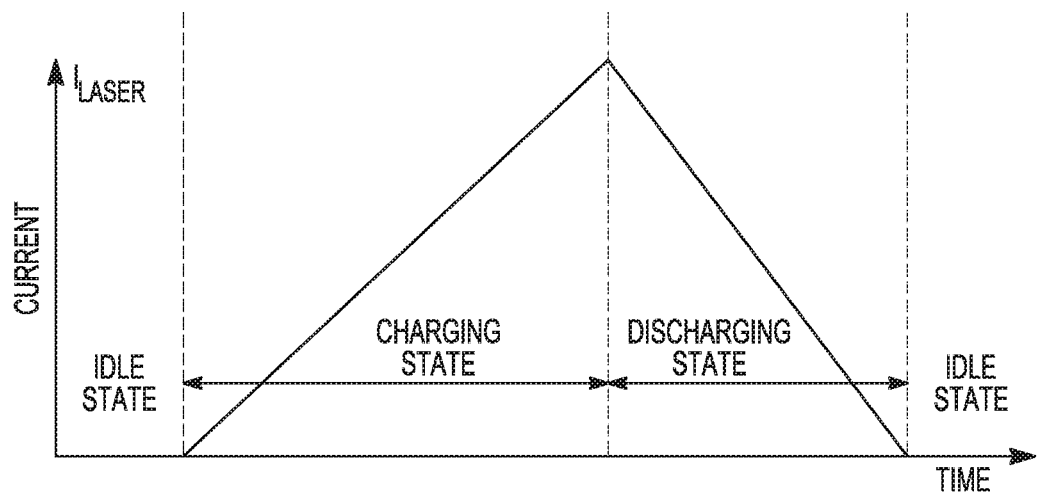

FIGS. 4A and 4B depict various waveforms associated with the circuit of FIG. 3. In FIG. 4A, the x-axis represents time and the y-axis represents voltage, and the graph depicts the voltage across the laser diode LD load of FIG. 3. As seen in FIG. 4A, the maximum charging voltage ($V_{DD}$) and the maximum discharging voltage ($-V_{DD}$) are limited with the supply voltage ($V_{DD}$) and the breakdown voltages of the switches.

In FIG. 4B, the x-axis represents time and the y-axis represents current, and the graph depicts the current through the laser diode LD of FIG. 3. Using the bridge topology of circuit 20 of FIG. 3, the current through the switch devices are equal to the laser diode LD current. Therefore, large switch devices are needed.

The present inventor has recognized that by modifying the non-resonant H-bridge topology of FIG. 3 into a resonant H-bridge topology, much high current levels can be obtained at narrow pulse widths while using smaller transistor sizes. The resonant H-bridge topology of this disclosure can utilize parasitic inductors that are unavoidable in conjunction with an external capacitor to create a resonant circuit in parallel with the load. Pulse widths from about 1 nsec to about 10 nsec can be obtained from a single package, which cannot be obtained using pre-charging architectures.

Figure 5:
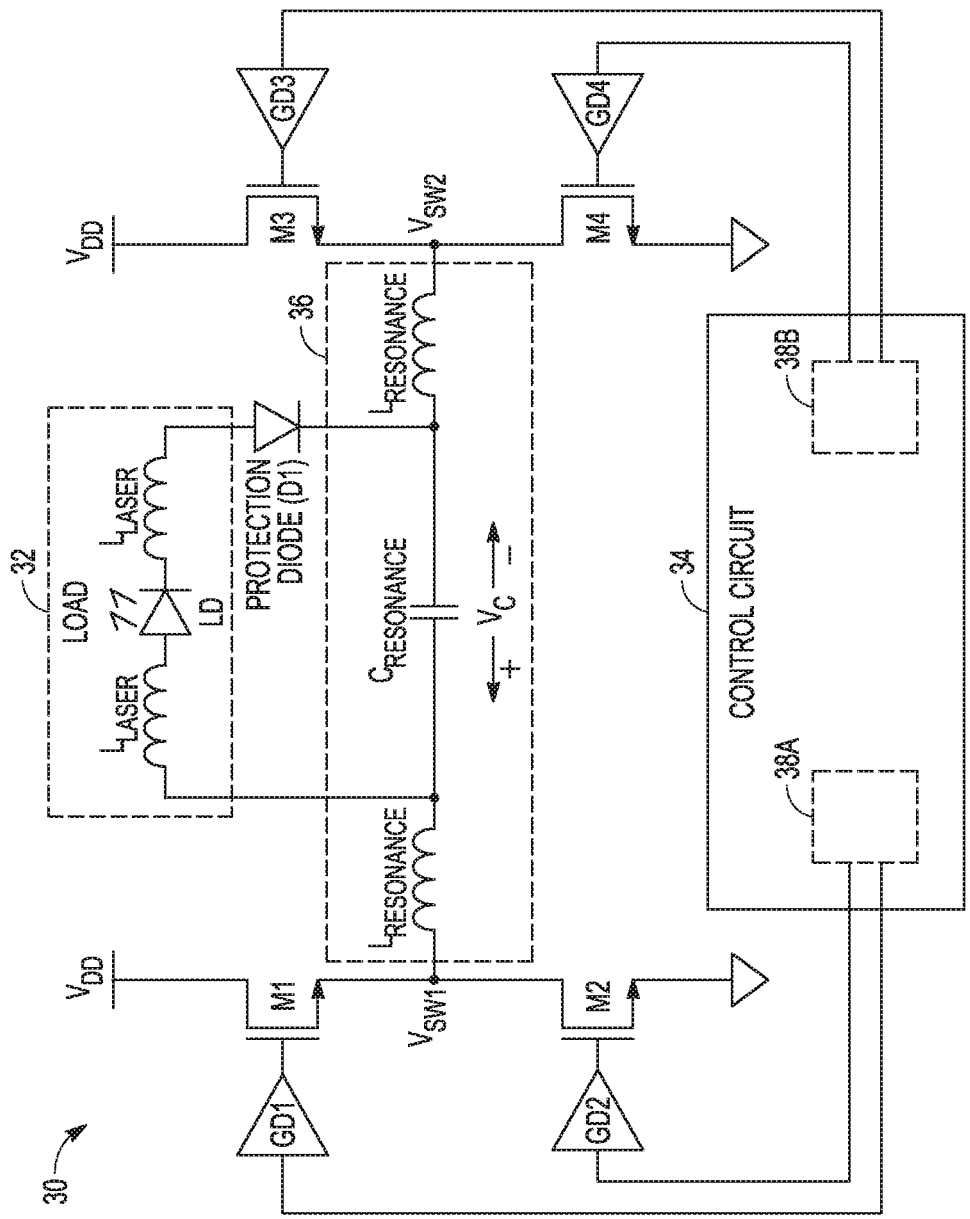
FIG. 5 is a schematic diagram of another example: of a laser diode driver circuit.

FIG. 5 is a schematic diagram of another example of a laser diode driver circuit 30. In particular, FIG. 5 depicts a resonant H-bridge topology of a laser diode driver circuit 30 that can implement various techniques of this disclosure. The circuit 30 can include a first pair of transistors M1, M2, a second pair of transistors M3, M4, and a load 32 coupled between the first and second pairs of transistors. The load can include a laser diode LD and one or more inductances $L_{laser}$. The transistors M1-M4 can be coupled to corresponding gate drivers GD1-GD4 and a control circuit 34 can control the operation of the transistors M1-M4.

As seen in FIG. 5 and in accordance with this disclosure, the circuit 30 can include a resonant circuit 36 coupled between the first and second pairs of transistors, where the resonant circuit 36 can include a capacitor $C_{RESONANCE}$ coupled in parallel with the load. The circuit 36 can generate a resonance between the capacitor $C_{RESONANCE}$ and the laser inductance $L_{LASER}$.

Figure 7:
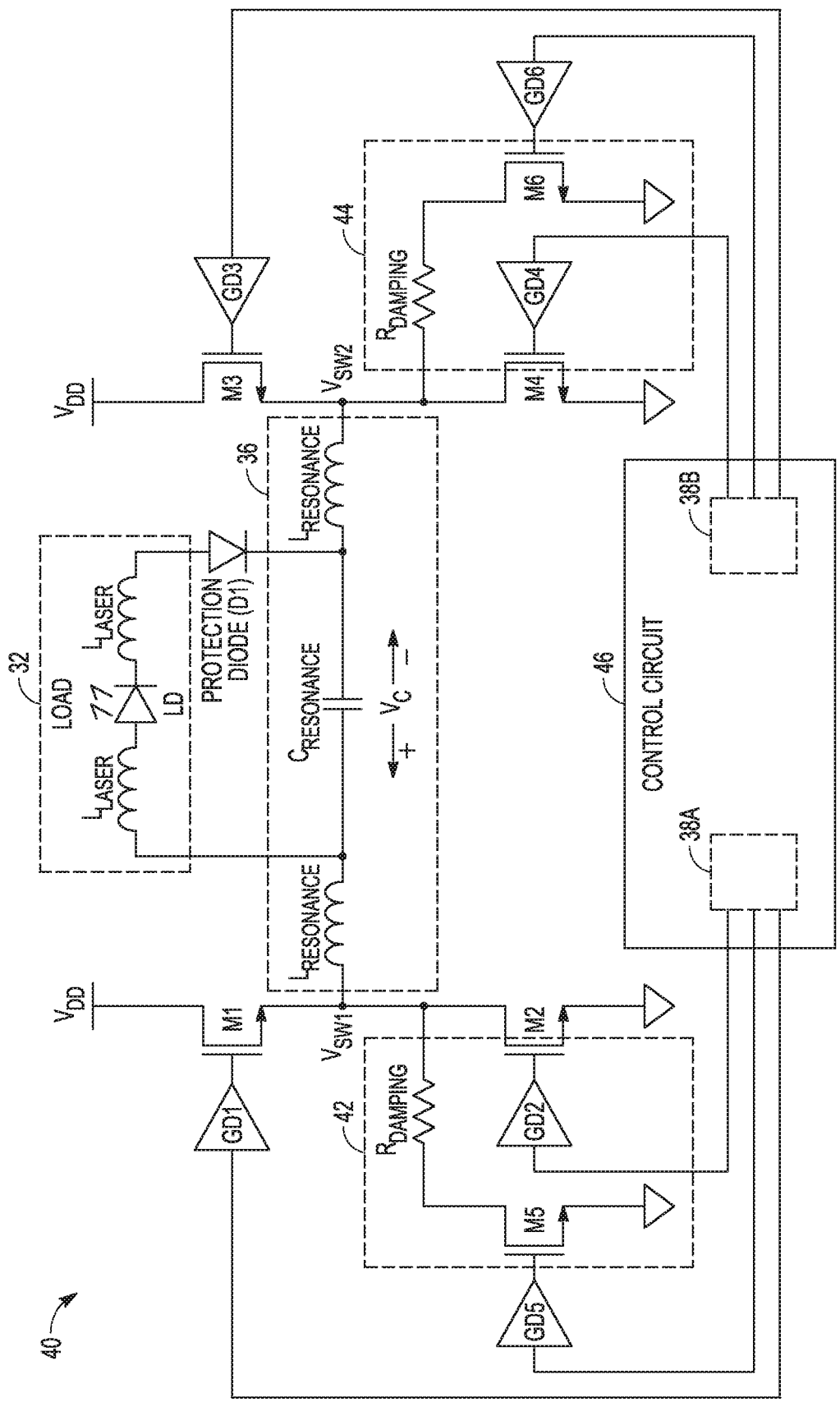
FIG. 7 is a schematic diagram of another example of a laser diode driver circuit.

Using the techniques of this disclosure, the voltage across the load can be much higher than the available supply voltage and the breakdown voltage of the switches. In the circuits of FIGS. 5 and 7, the capacitor $C_{RESONANCE}$ faces the large voltage, rather than the switches. As a result, a high di/dt can be achieved using lower voltage switches, e.g., rated for 30V-50V rather than 100V to 200V.

In the example implementation shown in FIG. 5, the resonant circuit 36 can include one or more resonance inductors $L_{RESONANCE}$ and be a series LC circuit. In some configurations, the parasitic inductance of one or more of the switch devices M1-M4 can be incorporated into the design of the resonant circuit 36 and function as one or more of the resonance inductors $L_{RESONANCE}$. In other words, the series LC circuit can include the capacitor $C_{RESONANCE}$ and at least one inductor, where the inductor is a parasitic inductance of one or both of the first and second pairs of transistors. In some examples, the capacitance of the capacitor $C_{RESONANCE}$ can be about 400 picofarads (for a narrow pulse) to about 1 nanofarad (for a wide pulse).

In other configurations, the series LC circuit can include the capacitor $C_{RESONANCE}$ and at least one inductor, where the inductor is an inductor separate from the parasitic inductance of the first and second pairs of transistors. In still other configurations, the series LC circuit use both a parasitic inductance of one or both of the first and second pairs of transistors and an inductor separate from the parasitic inductance of the first and second pairs of transistors.

The additional L and C components in the resonant circuit 36 of FIG. 5 can store charge and allow higher peak currents with narrow pulse widths than other topologies. Using the circuit 30 of FIG. 5, the voltage across the load can be much higher than both the available supply voltage and the breakdown voltage of the transistors. Only the resonance capacitor $C_{RESONANCE}$ faces these large voltages. As a result, a high di/dt can be achieved using low-voltage switches M1-M4. In addition, the switches M1-M4 can designed for lower current because the inductor $L_{RESONANCE}$ current ($I_{LRES}$) is less than the laser current ($I_{LASER}$).

However, the reverse voltage across the laser can exceed the supply voltage. As a result, in some example implementations, it can be desirable to include an electrical protection diode (D1) in series with the load to reduce the reverse voltage, and thus the voltage stress, on the laser diode LD. There will still be a high voltage across the resonance capacitor $C_{RESONANCE}$, but the laser diode LD will not see the reverse voltage because of the protection diode D1.

Figure 6A:
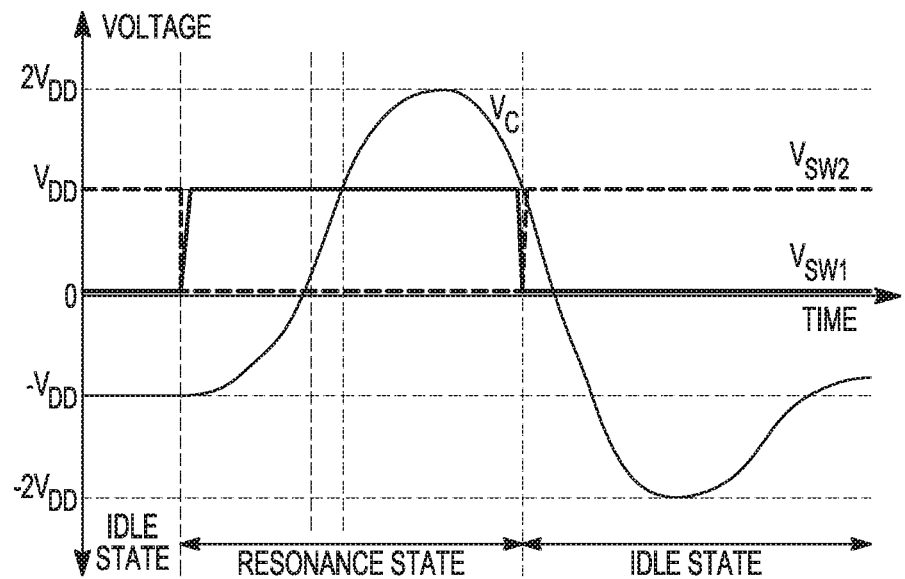
FIGS. 6A and 6B depict various waveforms associated with the circuit of FIG. 5.
Figure 6B:
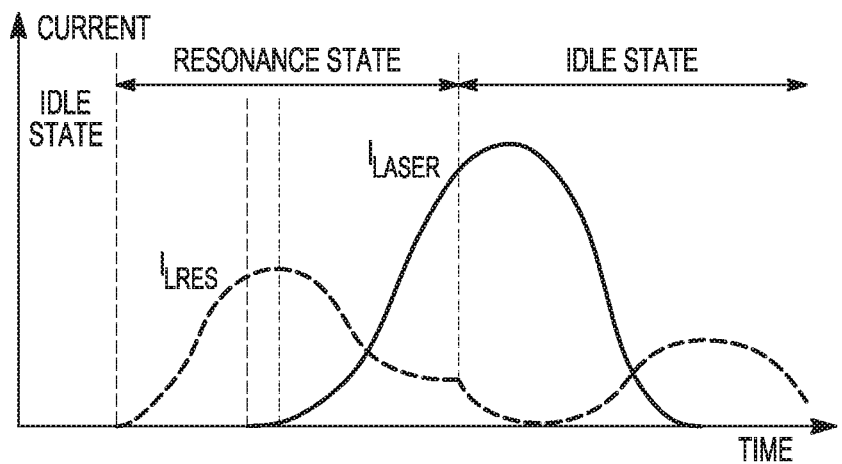

FIGS. 6A and 6B depict various waveforms associated with the circuit of FIG. 5. In FIG. 6A, the x-axis represents time and the y-axis represents voltage. The graph depicts the voltage $V_C$ across the resonance capacitor $C_{RESONANCE}$ of the resonant circuit 36 of FIG. 5, The graph further depicts the signals $V_{SW1}$ and $V_{SW2}$ at the nodes $V_{SW1}$ and $V_{SW2}$, respectively, of FIG. 5.

In FIG. 6B, the x-axis represents time and the y-axis represents current, and the graph depicts the laser diode current ($I_{LASER}$) and the current through the resonance inductor $L_{RESONANCE}$ ($I_{LRES}$).

The operation of the circuit 30 of FIG. 5 will be described together with the graphs of FIGS. 6A and 6B. In operation, the circuit 30 of FIG. 5 can have two states: an idle state and a resonance state.

In the idle state, the cathode side of the laser diode can be biased at the supply voltage $V_{DD}$ and the anode side can be grounded. For example, transistors M2 and M3 can be turned ON (to act as a short circuit) and transistors M1 and M4 can be turned OFF (to act as an open circuit). Therefore, in the idle state, a negative supply voltage appears across the resonance capacitor $C_{RESONANCE}$ of the resonant circuit 36 of FIG. 5, which is shown as voltage $-V_{DD}$ in FIG. 6A. At this point, the load is not conducting.

The resonance state begins by toggling the voltage $V_{SW1}$ at the node $V_{SW1}$ to the supply voltage $V_{DD}$ and the voltage $V_{SW2}$ at the node SW2 to ground. For example, the transistors M1 and M4 can be turned ON (to act as a short circuit) and the transistors M2 and M3 and be turned OFF (to act as an open circuit) during this state. The operation of the circuit 30 of FIG. 5 relies on the LC resonance of $L_{RESONANCE}$, $L_{LASER}$ and $C_{RESONANCE}$. The current passes through inductor $L_{RESONANCE}$, and charges the resonance capacitor $C_{RESONANCE}$.

During the resonance state, the laser diode LD does not start to conduct current until the voltage $V_C$ across the resonance capacitor $C_{RESONANCE}$ becomes positive and exceeds the threshold voltage of the laser diode LD. As a result, until the laser diode LD turns ON, the voltage $V_C$ is determined by the inductance $L_{RESONANCE}$, and the capacitance $C_{RESONANCE}$. Once the voltage $V_C$ exceeds the turn on voltage of the laser diode LD, the laser diode inductance is charged with $V_C$.

The voltage across the resonance capacitor $C_{RESONANCE}$ becomes $V_{DD}$ but continues to increase. The inductor $L_{RESONANCE}$ current ($I_{LRES}$) increases while charging $C_{RESONANCE}$. The inductor $L_{RESONANCE}$ current ($I_{LRES}$) begins to decrease after the voltage $V_C$ exceeds the supply voltage $V_{DD}$. The voltage $V_C$ increases to up to two times $V_{DD}$ ($2V_{DD}$) while the inductor $L_{RESONANCE}$ current ($I_{LRES}$) decreases. The high voltage $V_C$ can enable high di/dt of the laser current. After the voltage $V_C$ peaks and drops below a certain value, the switches return to the idle state configuration.

Based on the above, an example of a method of operating the laser diode driver circuit of FIG. 5 can be described as during a first state, controlling the first and second pairs of transistors to apply a reverse bias voltage across the laser diode and to apply a negative supply voltage across the capacitor. For example, during the idle state, the control circuit 34 can control the first pair of transistors M1, M2 and the second pair of transistors M3, M4 to apply a reverse bias voltage across the laser diode LD and to apply a negative supply voltage across the capacitor $C_{RESONANCE}$.

Then, during a second state, e.g., the resonance state, the method can include controlling the first and second pairs of transistors to apply a forward bias voltage across the laser diode LD and applying a positive supply voltage across the capacitor $C_{RESONANCE}$, and increasing a voltage across the capacitor $C_{RESONANCE}$ above the positive supply voltage, e.g., to 2VDD, and generating a laser pulse using the laser diode LD. A pulse width of the laser pulse can be controlled by controlling a duration of the second state.

In example configurations that include a protection diode D1, the method can further include controlling, e.g., via the control circuit 34, the first and second pairs of transistors to apply a reverse bias voltage across the laser diode and the protection diode D1.

In some example configurations, one or more delay elements 38A, 38B can be coupled to one or more of the switches M1-M4 of FIG. 5, e.g., as part of the control circuit 34. In some such configurations, the control circuit 34 can control a timing of one or more transistors of the first and second pairs of transistors using the delay elements 38A, 38B, e.g., of the control circuit.

In the operation of the circuit 30 of FIG. 5, the current on the H-Bridge switches M1-M4 is equal to inductor $L_{RESONANCE}$ current ($I_{LRES}$) and is smaller than the laser diode current $I_{LASER}$. This can allow the use of low voltage switches M1-M4, such as silicon-based transistors. Alternatively, gallium nitride (GaN) transistors can be used, for example.

In another example configuration, shown in FIG. 7, additional switches with series resistors can be added to the ground path of both the anode and cathode sides. The additional switches can be activated after the resonance state has ended and the damping resistors can accelerate the damping of the resonance.

FIG. 7 is a schematic diagram of another example of a laser diode driver circuit 40. In particular, FIG. 7 depicts a resonant H-bridge topology of a laser diode driver circuit 40 with damping circuitry that can implement various techniques of this disclosure. Many of the components in FIG. 7 are similar to those shown and described above with respect to FIG. 5 and, for purposes of conciseness, these components will be not described again.

As seen in FIG. 7, the circuit 40 can include a first damping circuit 42 having transistor M5 and resistor $R_{DAMP-ING}$ can be coupled the node $V_{SW1}$ between transistors of a first pair of transistors M1, M2. Similarly, the circuit 40 can include a second damping circuit 44 having transistor M6 and resistor $R_{DAMPING}$ can be coupled the node $V_{SW2}$ between transistors of a first pair of transistors M3, M4.

The switches M5, M6 and their corresponding series resistors can be added to the ground path of both the anode and cathode sides of the laser diode LD. These additional switches M5, M6 can be activated after the resonance state has ended and the damping resistors can accelerate the damping of the resonance.

In operation, the switches M5, M6 can track the operation of the switches M2, M4 and only in the damping time are the switches M5, M6 controlled to turn ON (and act as a short circuit). The switches M5, M6 connected to the damping resistors can be connected separately or, in some configurations, delay circuitry can be included, e.g., as part of the control circuitry 46, to control the switches with damping resistors.

In some example implementations, a transistor of the damping circuit can be smaller than the transistors of its associated pair of transistors of the H-Bridge circuit. In other words, a transistor of the first damping circuit, e.g., transistor M5, can be smaller than transistors of the first pair of transistors, e.g., transistors M1 and M2, and/or a transistor of the second damping circuit, e.g., transistor M6, can be smaller than transistors of the second pair of transistors, e.g., transistors M3 and M4. For example, the size ratio of a damping resistor, e.g., transistor M5, to one of the transistors in a pair of transistors, e.g., transistor M1, can be between about 1:5 and about 1:10, inclusive.

Figure 8A:
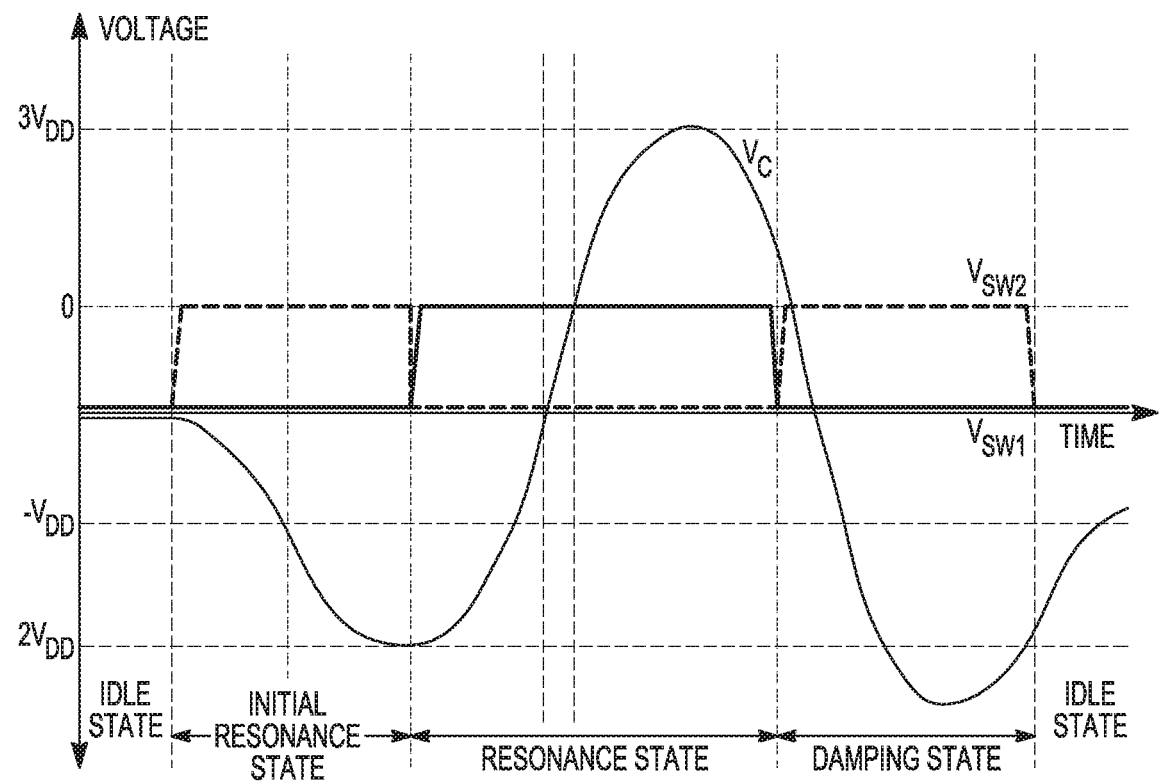
FIGS. 8A and 8B depict various waveforms associated with the circuit of FIG. 7.
Figure 8B:
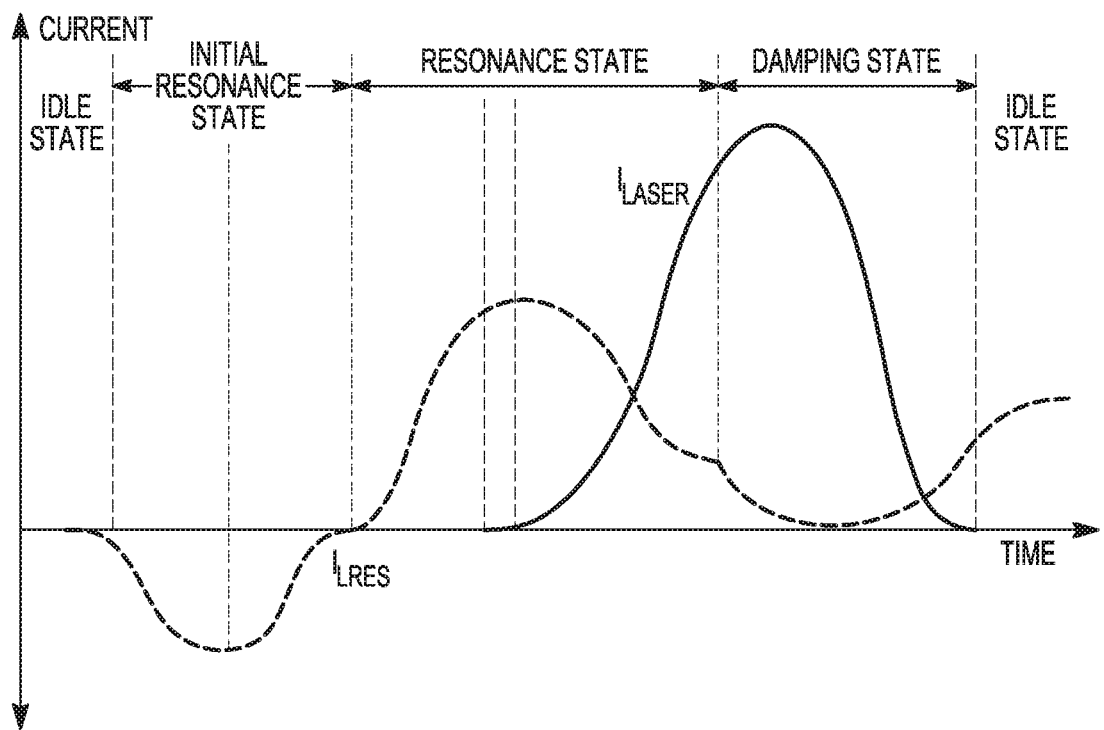

FIGS. 8A and 8B depict various waveforms associated with the circuit of FIG. 7. In FIG. 8A, the x-axis represents time and the y-axis represents voltage. The graph depicts the voltage $V_C$ across the resonance capacitor $C_{RESONANCE}$ of the resonant circuit 36 of FIG. 7, The graph further depicts the signals $V_{SW1}$ and $V_{SW2}$ at the nodes $V_{SW1}$ and $V_{SW2}$, respectively, of FIG. 5.

In FIG. 8B, the x-axis represents time and the y-axis represents current, and the graph depicts the laser diode current ($I_{LASER}$) and the current through the resonance inductor $L_{RESONANCE}$ ($I_{LRES}$).

The operation of the circuit 40 of FIG. 7 will be described together with the graphs of FIGS. 8A and 8B. In operation, the circuit 40 of FIG. 7 can have four states: an idle state, an initial resonance state, a resonance state, and a damping state.

In the idle state, both the anode and cathode sides of the laser diode can be grounded. M2 and M4 acts as short circuited, M1 and M3 open circuit. For example, transistors M2 and M4 can be turned ON (to act as a short circuit) and transistors M1 and M3 can be turned OFF (to act as an open circuit). Therefore, in the idle state, no voltage appears across the resonance capacitor $C_{RESONANCE}$ of the resonant circuit 36 of FIG. 7, which is shown in FIG. 8A.

The initial resonance state begins by toggling the node $V_{SW2}$ to the supply voltage $V_{DD}$. For example, the transistors M2 and M3 can be turned ON (to act as a short circuit) and the transistors M1 and M4 and be turned OFF (to act as an open circuit) during this state.

During, the initial resonance state, the laser diode LD does not conduct current. The current on the inductor $L_{RESONANCE}$ ($I_{LRES}$) increases while charging teh capacitor $C_{RESONANCE}$. The current $I_{LRES}$ starts to decrease after the voltage $V_C$ exceeds the voltage $-V_{DD}$. However, the voltage $V_C$ continues increasing and achieves a peak negative value while the current $I_{LRES}$ decreases to zero after a time $t=\pi$ $\sqrt{L_{RESONANCE}C_{RESONANCE}}$. The initial resonance state ends when the voltage $V_C$ achieves its peak negative value (−2VDD).

In the resonance state, the node $V_{SW1}$ is toggled to the supply voltage VDD and the node $V_{SW2}$ is toggled to ground. For example, the transistors M1 and M4 can be turned ON (to act as a short circuit) and the transistors M2 and M3 can be turned OFF (to act as an open circuit) during this state. The voltage across the $L_{RESONANCE}$ inductors can be about 3VDD in the beginning of the resonance state because the voltage $V_C$ is −2VDD and the switch voltages are +VDD. Therefore, the current $I_{LRES}$ can increase rapidly and achieve its peak value while $V_C$ is equal to VDD. However, the voltage $V_C$ continues increasing while the current $I_{LRES}$ decreases. The voltage $V_C$ can achieve a peak voltage of about 3VDD. The high voltage $V_C$ can enable a high di/dt of the laser current.

After the laser pulse is generated, the node $V_{SW2}$ can be toggled to VDD by turning ON transistor M3 (to act as a short circuit). To enter the damping state, the node $V_{SW1}$ can be connected to ground with a damping resistor by turning ON transistor M5 (to act as a short circuit). After the resonance dampens, the node $V_{SW2}$ can also be connected to ground with a damping resistor by turning OFF transistor M3 (to act as an open circuit) and turning ON transistor M6 (to act as a short circuit). In this manner, the system can return to the idle state.

Based on the above, an example of a method of operating the laser diode driver circuit of FIG. 7 can be described as during a first state, e.g., an idle state, a control circuit 46 can control the first pair of transistors M1, M2 and a second pair of transistors M3, M4 to couple an anode of the laser diode LD to a first voltage, e.g., ground, and a cathode of the laser diode LD to the first voltage, e.g., ground. Then, during a second state, e.g., the initial resonance state, the control circuit 46 can control the first and second pairs of transistors to apply a reverse bias voltage across the laser diode and to apply a negative supply voltage across the capacitor. During a third state, e.g., resonance state, the control circuit 46 can control the first and second pairs of transistors to apply a forward bias voltage across the laser diode and to apply a positive supply voltage across the capacitor. During the third state, the voltage across the capacitor can be increased above the positive supply voltage, e.g., 3VDD, and the laser diode can generate a laser pulse. A pulse width of the laser pulse can be controlled by controlling a duration of the third state. The voltage achievable above the positive supply voltage, e.g., 3VDD, can be changed by changing the ratio of the inductance of the laser and the capacitance of the resonance capacitor.

In example configurations that include a protection diode D1, the method can further include controlling, e.g., via the control circuit 46, the first and second pairs of transistors to apply a reverse bias voltage across the laser diode and the protection diode D1.

In example configurations that include a damping circuit, an example method of operating the circuit of FIG. 7 can include controlling a transistor of the damping circuit to turn ON after generating the laser pulses. In configurations that further includes a second damping circuit, the example method can further include controlling the transistor of the second damping circuit to turn ON after turning ON the transistor of the first damping circuit.

In some example configurations, delay elements 38A, 38B can be coupled to one or more of the switches M1-M4 of FIG. 7, e.g., as part of the control circuit 46. In some such configurations, the control circuit 46 can control a timing of one or more transistors of the first and second pairs of transistors using the delay elements, e.g., of the control circuit.

In order for the voltage $V_C$ to reach a peak negative value during the resonance state, the control circuit, e.g., the control circuit 34 of FIG. 5 or the control circuit 46 of FIG. 7, can control a duration of the resonance state. For example, the control circuit can control a duration of the resonance state to match a natural resonance frequency of the resonant circuit to achieve a peak negative voltage across the load. The duration can be determined by $t=\pi\sqrt{L_{RESONANCE}C_{RESONANCE}}$, e.g., to achieve −2VDD.

In the operation of the circuit 40 of FIG. 7, the current on the H-Bridge switches M1-M4 is equal to inductor $L_{RESONANCE}$ current ($I_{LRES}$) and is smaller than the laser diode current $I_{LASER}$. This can allow the use of low voltage switches M1-M4, such as silicon-based transistors, which can be smaller than gallium nitride (GaN) transistors, for example, and used at lower voltages, e.g., between about 30V-50V. Alternatively, gallium nitride (GaN) transistors can be used.

In some example implementations of the circuits shown in FIGS. 5 and 7, at least one of the first pair of transistors can configured to couple to a high voltage supply rail of between about 30 volts and about 50 volts, inclusive. In this disclosure, voltages of the high voltage supply nodes or rails are large enough to exceed a voltage capability of a low voltage transistor structure in the circuit but not large enough to exceed a voltage capability of a high voltage transistor structure in the circuit, and voltages of low voltage supply nodes are low enough to accommodate a voltage capability of a low voltage transistor structure in the circuit.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A laser diode driver circuit having an H-bridge configuration having first and second pairs of transistors, the laser diode driver circuit comprising:
   a load including a laser diode and a load inductance, the load coupled between the first and second pairs of transistors; and
   a resonant circuit coupled between the first and second pairs of transistors, the resonant circuit including a capacitor coupled in parallel with the load, wherein the resonant circuit includes a series LC circuit, wherein the series LC circuit includes the capacitor and at least one inductor, and wherein the resonant circuit is sized to generate a resonance with the load inductance.

2. The laser diode driver circuit of claim 1; wherein the at least one inductor is a parasitic inductance of one or both of the first and second pairs of transistors.

3. The laser diode driver circuit of claim 1, wherein the at least one inductor is an inductor separate from the parasitic inductance of the first and second pairs of transistors.

4. The laser diode driver circuit of claim 1, further comprising a diode coupled in series with the load.

5. The laser diode driver circuit of claim 1, further comprising:
   a first damping circuit coupled to a node between transistors of the first pair of transistors, the first damping circuit including a damping resistor and a transistor; and
   a second damping circuit coupled to a node between transistors of the second pair of transistors, the second damping circuit including a damping resistor and a transistor.

6. The laser diode driver circuit of claim 5, wherein the transistor of the first damping circuit is smaller than transistors of the first pair of transistors, and wherein the transistor of the second damping circuit is smaller than transistors of the second pair of transistors.

7. The laser diode driver circuit of claim 1, wherein the transistors are silicon-based transistors.

8. The laser diode driver circuit of claim 1, wherein the transistors are gallium nitride (GaN) transistors.

9. The laser diode driver circuit of claim 1, wherein at least one of the first pair of transistors is configured to couple to a supply rail of between about 30 volts and about 50 volts, inclusive.

10. A method of operating a laser diode driver circuit having an H-bridge configuration having first and second pairs of transistors, a load including a laser diode, the load coupled between the first and second pairs of transistors, and a resonant circuit coupled between the first and second pairs of transistors, the resonant circuit including a capacitor coupled in parallel with the load, the method comprising:
    during a first state, controlling the first and second pairs of transistors to apply a reverse bias voltage across the laser diode and to apply a negative supply voltage across the capacitor;
    during a second state:
    controlling the first and second pairs of transistors to apply a forward bias voltage across the laser diode and to apply a positive supply voltage across the capacitor; and
    increasing a voltage across the capacitor above the positive supply voltage and generating a laser pulse using the laser diode.

11. The method of claim 10, wherein the laser diode circuit further includes a diode coupled in series with the load, and
    wherein controlling the first and second pairs of transistors to apply a reverse bias voltage across the laser diode and to apply a negative supply voltage across the capacitor includes:
    controlling the first and second pairs of transistors to apply a reverse bias voltage across the laser diode and the diode.

12. The method of claim 10, further comprising:
    controlling a timing of one or more transistors of the first and second pairs of transistors using delay elements coupled to the first and second pairs of transistors.

13. The method of claim 10, further comprising:
    controlling a pulse width by controlling a duration of the second state.

14. A method of operating a laser diode driver circuit having an H-bridge configuration having first and second pairs of transistors, a load including a laser diode, the load coupled between the first and second pairs of transistors, and a resonant circuit coupled between the first and second pairs of transistors, the resonant circuit including a capacitor coupled in parallel with the load, the method comprising:

during a first state, controlling the first and second pairs of transistors to couple: an anode of the laser diode to a first voltage and a cathode of the laser diode to the first voltage;

during a second state, controlling the first and second pairs of transistors to apply a reverse bias voltage across the laser diode and to apply a negative supply voltage across the capacitor; and during a third state:

controlling the first and second pairs of transistors to apply a forward bias voltage across the laser diode and to apply a positive supply voltage across the capacitor; and increasing a voltage across the capacitor above the positive supply voltage and generating a laser pulse using the laser diode.

15. The method of claim 14, further comprising:
controlling a pulse width by controlling a duration of the third state.

16. The method of claim 14, wherein the laser diode driver circuit further comprises:
a first damping circuit coupled to a node between transistors of the first pair of transistors, the first damping circuit including a damping resistor and a transistor, the method further comprising:
controlling the transistor of the first damping circuit to turn ON after generating the laser pulses.

17. The method of claim 14, wherein the laser diode driver circuit further comprises:
a second damping circuit coupled to a node between transistors of the second pair of transistors, the second damping circuit including a damping resistor and a transistor, the method further comprising:
controlling the transistor of the second damping circuit to turn ON after turning ON the transistor of the first damping circuit.

18. The method of claim 14, further comprising:
controlling a timing of one or more transistors of the first and second pairs of transistors using delay elements coupled to the first and second pairs of transistors.

19. The method of claim 14, further comprising:
controlling a duration of the third state to match a natural resonance frequency of the resonant circuit to achieve a peak negative voltage across the load.

20. A laser diode driver circuit having an H-bridge configuration having first and second pairs of transistors, the laser diode driver circuit comprising:

a load including a laser diode, the load coupled between the first and second pairs of transistors; and a resonant circuit coupled between the first and second pairs of transistors, the resonant circuit including a capacitor coupled in parallel with the load, wherein the resonant circuit includes a series LC circuit, and wherein the series LC circuit includes the capacitor and at least one inductor, and wherein the at least one inductor is an inductor separate from the parasitic inductance of the first and second pairs of transistors.

21. The laser diode driver circuit of claim 20, wherein the resonant circuit includes a series LC circuit.

22. A laser diode driver circuit having an H-bridge configuration having first and second pairs of transistors, the laser diode driver circuit comprising:

a load including a laser diode, the load coupled between the first and second pairs of transistors;

a resonant circuit coupled between the first and second pairs of transistors, the resonant circuit including a capacitor coupled in parallel with the load;

a first damping circuit coupled to a node between transistors of the first pair of transistors, the first damping circuit including a damping resistor and a transistor; and a second damping circuit coupled to a node between transistors of the second pair of transistors, the second damping circuit including a damping resistor and a transistor.

23. The laser diode driver circuit of claim 22, wherein the transistor of the first damping circuit is smaller than transistors of the first pair of transistors, and wherein the transistor of the second damping circuit is smaller than transistors of the second pair of transistors.

* * * * *

UNITED STATES PATENT AND TRADEMARK OFFICE
CERTIFICATE OF CORRECTION

PATENT NO. : 11,070,026 B2  
APPLICATION NO. : 16/517293  
DATED : July 20, 2021  
INVENTOR(S) : Ercan Kaymaksut Page 1 of 1

It is certified that error appears in the above-identified patent and that said Letters Patent is hereby corrected as shown below:

In the Claims

In Column 11, Line 65, in Claim 2, delete "claim 1;" and insert --claim 1,-- therefor In Column 13, Line 6, in Claim 14, delete "couple:" and insert --couple-- therefor In Column 14, Line 25, in Claim 22, delete "transistors:" and insert --transistors;-- therefor Signed and Sealed this  
First Day of March, 2022

Drew Hirshfeld  
*Performing the Functions and Duties of the*  
*Under Secretary of Commerce for Intellectual Property and*  
*Director of the United States Patent and Trademark Office*